United States Patent
MacLeod

(10) Patent No.: US 7,259,981 B1
(45) Date of Patent: Aug. 21, 2007

(54) NONVOLATILE ANALOG MEMORY

(75) Inventor: Todd C. MacLeod, Madison, AL (US)

(73) Assignee: United States of America as represented by the Administrator of the National Aeronautics and Space Administration, Washington, DC (US)

( * ) Notice: Subject to any disclaimer, the term of this patent is extended or adjusted under 35 U.S.C. 154(b) by 15 days.

(21) Appl. No.: 11/296,719

(22) Filed: Nov. 29, 2005

(51) Int. Cl.
*G11C 11/22* (2006.01)
(52) U.S. Cl. ...................... 365/145; 365/148
(58) Field of Classification Search ............... 365/145, 365/185, 45
See application file for complete search history.

(56) References Cited

U.S. PATENT DOCUMENTS

| | | | | |
|---|---|---|---|---|
| 4,161,038 A | * | 7/1979 | Wu | 365/145 |
| 5,412,596 A | * | 5/1995 | Hoshiba | 365/145 |
| 5,689,453 A | * | 11/1997 | Tsukagoshi | 365/45 |
| 5,907,501 A | * | 5/1999 | Hwang | 365/45 |
| 6,208,542 B1 | * | 3/2001 | Wang et al. | 365/45 |
| 6,314,016 B1 | * | 11/2001 | Takasu | 365/145 |
| 6,323,799 B1 | * | 11/2001 | Pasotti et al. | 341/156 |
| 6,498,742 B2 | * | 12/2002 | Chu | 365/145 |

OTHER PUBLICATIONS

Hiroshi Ishiwara, "Current Status of FET-Type Ferroelectric Memories", May 2000, Proc. 22nd International Conference on Microelectronic, vol. 2, SERBIA, IEEE.*

Von-Kyoung Kim, "Fault Coverage Estimation for Early Stage of VLSI design", Mar. 1999, IEEE.*
Sung-Ming Yoon, "An Electrically Modifiable Synapse Array Composed of Metal-Ferroelectric-Semiconductor (MFS) FET's Using SrBi2Ta2O9 Thin Films", May 1999, IEEE electron Device Letters vol. 20, No. 5.*
Shun-ichiro Ohmi, "Device Characterization of High-Electron-Mobility Transistors with Ferroelectric-Gate Structures", 1996, IEEE.*
Sung-Ming Yoon, "Adaptive-Learning Neuron Integrated Circuits Using Metal-Ferroelectric-Semiconductor (MFS) FET's", Oct. 1999, IEEE Electron Device Letters vol. 20, No. 10.*
Wen Chen, "On Simple Oversampled A/D Conversion in Shift-Invariant Spaces", Feb. 2005, IEEE Transactions on Information Theory vol. 51.*
Todd C. MacLeod et al., "Modeling of Metal-Ferroelectric-Semiconductor Field Effect Transistors," Integrated Ferroelectrics, vol. 21, pp. 127-143, 1998.

* cited by examiner

*Primary Examiner*—Patrick Assouad
*Assistant Examiner*—Han Yang
(74) *Attorney, Agent, or Firm*—James J. McGroary; Peter J. Van Bergen

(57) ABSTRACT

A nonvolatile analog memory uses pairs of ferroelectric field effect transistors (FFETs). Each pair is defined by a first FFET and a second FFET. When an analog value is to be stored in one of the pairs, the first FFET has a saturation voltage applied thereto, and the second FFET has a storage voltage applied thereto that is indicative of the analog value. The saturation and storage voltages decay over time in accordance with a known decay function that is used to recover the original analog value when the pair of FFETs is read.

13 Claims, 1 Drawing Sheet

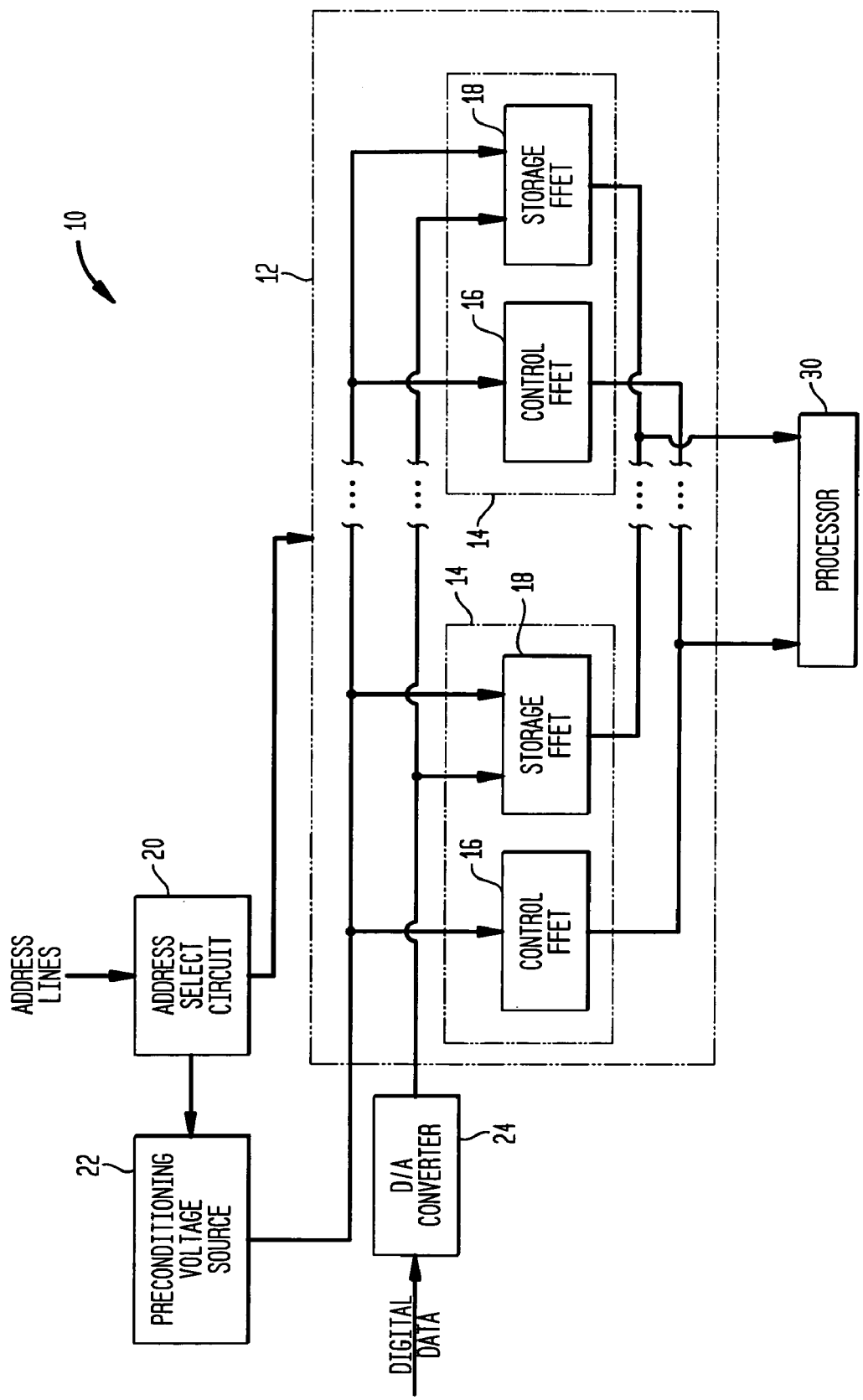

NONVOLATILE ANALOG MEMORY

ORIGIN OF THE INVENTION

The invention was made by an employee of the United States Government and may be manufactured and used by or for the Government for governmental purposes without the payment of any royalties thereon or therefore.

BACKGROUND OF THE INVENTION

1. Field of the Invention

This invention relates to nonvolatile memory devices. More specifically, the invention is a nonvolatile analog memory and method of using same to store and retrieve analog data.

2. Description of the Related Art

There is a continuing need to increase the density of memory storage devices. The number of bytes per square centimeter is of great importance to digital device manufacturers as is the ability to retain the stored data without power being applied thereto. Currently, data is stored in a digital fashion with digital data typically being stored in CMOS circuits, RAM circuits, FLASH memory circuits, or ferroelectric memory circuits.

Standard CMOS digital memory is static and utilizes six transistors to store 1-bit of data. Dynamic RAM can store 1-bit using only three transistors, but these transistors must be refreshed every few milliseconds. Further, both static and dynamic RAM are volatile and cannot store data without power being applied thereto. For nonvolatile memory applications, FLASH memory is the most widely used technology as it can store 1-bit of data using a single transistor. However, FLASH memory is limited to use as an offline data storage device because the time it takes to write data thereto is considerably longer than the time required to write to other conventional memory devices. Furthermore, FLASH memory has a finite number of "write" cycles associated therewith thereby making FLASH memory an impractical choice for the dynamic storage of computer data. Ferroelectric memory is developing technology that currently is used to store 1-bit per cell.

While analog storage circuits are known, storing data in analog fashion has not been generally accepted as a viable alternative to digital data storage since analog signals usually disappear whenever power is removed from an analog storage circuit. Although ferroelectric transistors have shown promise as a means to store an analog signal for a relatively long period of time, the voltage stored on current ferroelectric transistors (i.e., indicative of the analog signal) experiences some voltage decay over time thereby negating the value of ferroelectric transistors as a building block for nonvolatile memory.

SUMMARY OF THE INVENTION

Accordingly, it is an object of the present invention to provide nonvolatile memory.

Another object of the present invention is to provide nonvolatile analog memory.

Still another object of the present invention is to provide a method and system for storing analog data in a nonvolatile fashion and for recovering the analog data after extended periods of time.

Other objects and advantages of the present invention will become more obvious hereinafter in the specification and drawings.

In accordance with the present invention, a nonvolatile analog memory is based on pairs of ferroelectric field effect transistors (FFETs). Each pair is defined by a first FFET and a second FFET. At a first time when an analog value is to be stored in one of the pairs of FFETs, the first FFET of the pair is adapted to have a saturation voltage applied thereto, and the second FFET of the pair is adapted to have a storage voltage applied thereto that is indicative of the analog value. The saturation and storage voltages decay over time in accordance with a known decay function. Accordingly, at a second time after the first time, the saturation voltage decays to a first voltage and the storage voltage decays to a second voltage. The analog memory can be read by a processor that determines/recovers the analog value based on the first voltage, the second voltage, and the FFET's decay function.

BRIEF DESCRIPTION OF THE DRAWING(S)

Other objects, features and advantages of the present invention will become apparent upon reference to the following description of the preferred embodiments and to the drawings, wherein corresponding reference characters indicate corresponding parts throughout the several views of the drawings and wherein:

The sole FIGURE is a block diagram of a nonvolatile analog memory storage system in accordance with an embodiment of the present invention.

DESCRIPTION OF THE PREFERRED EMBODIMENT(S)

Referring now to the sole FIGURE, a block diagram of a nonvolatile analog memory storage system in accordance with the present invention is shown and is referenced generally by numeral 10. As will be explained further below, storage system 10 can be used to store data in an analog fashion although the data can originate as either digital or analog data without departing from the scope of the present invention.

At the heart of storage system 10 is a novel analog memory 12 that encompasses a number of pairs 14 of conventional ferroelectric field effect transistors (FFETs) Since each pair 14 of FFETs is the same and will be used in the same way, the present description will be directed to a single pair 14. Each pair 14 of FFETs is defined by a control FFET 16 and a storage FFET 18. In general, storage FFET 18 stores analog data and control FFET 16 stores a reference voltage used when data is to be read/recovered from storage FFET 18 as will be explained further below.

To write analog data, one pair 14 of FFETs is utilized. Since FFETs retain at least a portion of their prior condition, control FFET 16 and storage FFET 18 must be preconditioned to a known state. This can be achieved by applying a voltage to control FFET 16 and storage FFET 18 (e.g., to the gate terminal thereof) that will saturate the transistor thereby placing it in a known state. Typically, FFETs 16 and 18 will be constructed to have the same saturation voltage specifications. Note that the saturation voltage can be a positive or negative saturation voltage without departing from the scope of the present invention. However, as is known in the art, use of a negative saturation voltage permits the resistance of the FFET to be read without applying a voltage to the FFET's gate terminal.

After such preconditioning, storage FFET 18 has a new voltage applied thereto (e.g., at its gate terminal) that is indicative of an analog signal that is to be stored. After these voltage applications to control FFET 16 and storage FFET 18 are completed, no further power need be applied to maintain the storage capability thereof within the known "decay life" of FFETs 16 and 18. As is known in the art, a voltage stored on an FFET will decay over time absent a refreshing thereof. Accordingly, as used herein, the term "decay life" refers to the length of time that an FFET circuit will retain some measurable amount of voltage after its initial storage. Currently, the decay life of an FFET can be as long as ten years. A decay function indicative of an FFET's decay life is a determinable attribute of an FFET. See, for example, "Modeling of Metal-Ferroelectric-Semiconductor Field Effect Transistors," Todd MacLeod et al., Integrated Ferroelectrics, Vol. 21, pp. 127-143, 1998, the contents of which are hereby incorporated by reference.

To read the analog data stored in a pair 14 of FFETs, the electrical properties (e.g., voltage or current) of the pair's control FFET 16 and storage FFET 18 are measured. During the time between the writing and reading of FFETs 16 and 18, there will be a certain amount of voltage decay that occurs. The amount of voltage decay is generally governed by the FFET's decay function. Accordingly, while the voltages remaining on FFETs 16 and 18 at the time of a "reading" will generally by less than what was placed on FFETs 16 and 18 at the time of a "writing", the original storage voltage placed on storage FFET 18 can be recovered using the decay function and the current (decayed) voltages on FFETs 16 and 18. A variety of recovery algorithms could be developed for use with analog memory 12 without departing from the scope of the present invention.

Analog memory 12 can serve as the building block for a variety of memory storage systems such as storage system 10. By way of illustrative example, storage system 10 is designed to handle incoming digital data, convert the digital data to analog data prior to the writing thereof in analog memory 12, and provide the means to recover the analog data and re-convert same to digital data when analog memory 12 is read. To handle the selection of a pair 14 of FFETs 16 and 18, an address select circuit 20 is coupled to analog memory 12. As would be understood in the art, address select circuit 20 selects the appropriate addressable pair 14 based on a signal received on the ADDRESS LINES coupled thereto. A preconditioning voltage source 22 provides the saturation voltage to FFETs 16 and 18 of a selected pair. The incoming DIGITAL DATA is input to a digital-to-analog (D/A) converter 24 that assigns an analog value (i.e., a voltage level) to a piece of incoming digital data. The number of voltage levels coincides with the number of bits in a piece of digital data. For example, an 8-bit piece of digital data requires a D/converter that can produce 256 different voltage levels. The analog voltage level is then provided to the appropriate (i.e., addressed) storage FFET 18 that has just been preconditioned or saturated.

When analog memory 12 is to be read, address select circuit 20 once again selects the appropriate addressable pair 14 based on the signal received via the ADDRESS LINES. A processor 30 coupled to analog memory 12 "reads" FFETs 16 and 18 from the selected pair 14. By way of illustrative example, a "reading" of FFETs 16 and 18 from the selected pair 14 can involve measurement of the drain current at each of FFETs 16 and 18 as an indication of the FFET's voltages at the time of such a "reading". Using the drain currents, the original analog voltage level written to storage FFET 18 can be recovered in accordance with the following $$X = A - (B * \text{Log}\ [10*((A-I_{16})/B) - 10*((A-I_{18})/B)])$$

where X is the analog voltage level originally written to storage FFET 18, A is the drain current of control FFET 16 (or storage FFET 18 when FFETs 16 and 18 are identical) when the FFET is at saturation, B is the known or determinable decay coefficient of FFETs 16 and 18, $I_{16}$ is the drain current of FFET 16 at the time of a "reading", and $I_{18}$ is the drain current of storage FFET 18 at the time of a "reading". Assuming that the goal is to recover the original digital data, processor 30 can include a conventional analog-to-digital conversion process to convert X to a corresponding digital value. The decay coefficient B of an FFET can be based on measured results using $$X = A - (B * \text{Log}(t))$$

where t is the amount of time that has elapsed between saturation of the FFET and a selected measurement time.

The advantages of the present invention are numerous. The analog memory is nonvolatile and only uses two transistors to store multiple-bit pieces of digital data. Since FFETs are fast enough to directly store data generated by a computer's CPU, and since FFETs can be written to an unlimited number of times, the analog memory of the present invention represents a breakthrough in nonvolatile and dynamic computer memory. Furthermore, the analog memory can be used as a building block for a memory storage system that provides for the writing of data to the analog memory and for the reading/recovery of the originally stored data.

Although the invention has been described relative to a specific embodiment thereof, there are numerous variations and modifications that will be readily apparent to those skilled in the art in light of the above teachings. For example, the data stored by analog memory 12 could originate as analog data. In such a case, an analog-to-analog conversion or scaling may be required to scale the range of incoming data voltages to the voltage range capabilities of the storage FFETs. It is therefore to be understood that, within the scope of the appended claims, the invention may be practiced other than as specifically described.

What is claimed as new and desired to be secured by Letters Patent of the United States is:

1. A nonvolatile analog memory comprising a plurality of pairs of ferroelectric field effect transistors (FFETs), each of said pairs being defined by a first FFET and a second FFET, wherein at a first time when an analog value is to be stored in one of said pairs, said first FFET of said one of said pairs is adapted to have a saturation voltage applied thereto, and only said second FFET of said one of said pairs is adapted to have a storage voltage applied thereto that is indicative of the analog value.

2. A nonvolatile analog memory as in claim 1, wherein the saturation voltage and the storage voltage decay over time in accordance with a known decay function wherein, at a second time after said first time, the saturation voltage decays to a first voltage and the storage voltage decays to a second voltage, said nonvolatile analog memory further comprising a processor coupled to said pairs of FFETs for determining the analog value based on said first voltage, said second voltage, and said decay function.

3. A nonvolatile analog memory as in claim 2 wherein said processor includes means for converting the analog value so-determined to a corresponding digital value.

4. A nonvolatile analog memory as in claim 1, wherein the saturation voltage and the storage voltage decay over time in accordance with a known decay function wherein, at a second time after said first time, the saturation voltage decays to a first voltage and the storage voltage decays to a second voltage, said nonvolatile analog memory further comprising a processor coupled to said pairs of FFETs for determining a digital value indicative of the analog value based on a drain current of said first FFET indicative of said first voltage, a drain current of said second FFET indicative of said second voltage, and said decay function.

5. A nonvolatile analog memory as in claim 1 wherein the saturation voltage is a negative saturation voltage.

6. A nonvolatile analog memory storage system, comprising:
- a plurality of pairs of ferroelectric field effect transistors (FFETs), each of said pairs being addressable and being defined by a first FFET and a second FFET;
- an address selection circuit coupled to said plurality of pairs of FFETs for selecting one of said pairs that is to be written to or read from;
- a control voltage source coupled to said pairs of FFETs for applying a saturation voltage to said first FFET and said second FFET of said one of said pairs at a first time when an analog value is to be written to said one of said pairs, wherein only said second FFET of said one of said pairs is adapted to subsequently have a storage voltage applied thereto that is indicative of the analog value, and wherein the saturation voltage and the storage voltage decay over time in accordance with a known decay function such that, at a second time after said first time when said one of said pairs is to be read from, the saturation voltage decays to a first voltage and the storage voltage decays to a second voltage; and
- a processor coupled to said pairs of FFETs for determining the analog value at said second time based on said first voltage, said second voltage, and said decay function.

7. A nonvolatile analog memory storage system as in claim 6 wherein said processor includes means for converting the analog value so-determined to a corresponding digital value.

8. A nonvolatile analog memory storage system as in claim 6 wherein said processor utilizes a drain current of said first FFET as an indication of said first voltage and a drain current of said second FFET as an indication of said second voltage.

9. A nonvolatile analog memory as in claim 6 wherein the saturation voltage is a negative saturation voltage.

10. A method of storing analog data, comprising the steps of:
- providing a plurality of addressable pairs of ferroelectric field effect transistors (FFETs), each of said addressable pairs being defined by a first FFET and a second FFET;
- applying, at a first time when an analog value is to be stored in one of said addressable pairs, a saturation voltage to said first FFET and said second FFET; and
- subsequently applying a storage voltage that is indicative of an analog value to only said second FFET of said one of said addressable pairs.

11. A method according to claim 10, wherein the saturation voltage and the storage voltage decay over time in accordance with a known decay function wherein, at a second time after said first time, the saturation voltage decays to a first voltage and the storage voltage decays to a second voltage, said method further comprising the step of determining the analog value based on said first voltage, said second voltage, and said decay function.

12. A method according to claim 11 further comprising the step of converting the analog value so-determined to a corresponding digital value.

13. A method according to claim 10 wherein said saturation voltage is a negative saturation voltage.

* * * * *